United States Patent [19]
Yamamoto

[11] Patent Number: 5,925,931
[45] Date of Patent: Jul. 20, 1999

[54] SEMICONDUCTOR DEVICE HAVING INTERCONNECT LINES AND CONNECTION ELECTRODES FORMED IN GROOVE PORTIONS OF AN INSULATING LAYER

[75] Inventor: Mitsuhiko Yamamoto, Akishima, Japan

[73] Assignee: Casio Computer Co., Ltd., Tokyo, Japan

[21] Appl. No.: 08/956,140

[22] Filed: Oct. 22, 1997

[30] Foreign Application Priority Data

Oct. 31, 1996 [JP] Japan ...................................... 8-304193

[51] Int. Cl.[6] .......................... H01L 23/528; H01L 23/48; H01L 23/52
[52] U.S. Cl. .......................... 257/737; 257/738; 257/784; 257/786; 257/758; 257/778; 257/780
[58] Field of Search ...................................... 257/737, 738, 257/734, 758, 690, 692, 693, 697, 698, 700, 778–780, 784, 786

[56] References Cited

U.S. PATENT DOCUMENTS

| 4,720,738 | 1/1988 | Simmons ................................ 257/738 |
| 4,984,061 | 1/1991 | Matsumoto .............................. 257/786 |
| 5,394,013 | 2/1995 | Oku et al. ................................. 257/78 |
| 5,604,379 | 2/1997 | Mori ........................................ 257/737 |
| 5,661,344 | 8/1997 | Havemann et al. ..................... 257/758 |
| 5,719,439 | 2/1998 | Iwasaki et al. .......................... 257/786 |
| 5,757,078 | 5/1998 | Matsuda et al. ........................ 257/738 |
| 5,801,446 | 9/1998 | DiStefano et al. ...................... 257/778 |

FOREIGN PATENT DOCUMENTS

| 55-78549 | 6/1980 | Japan ..................................... 257/737 |
| 58-200526 | 11/1983 | Japan ..................................... 257/737 |
| 63-78555 | 4/1988 | Japan ..................................... 257/737 |
| 2-260425 | 10/1990 | Japan ..................................... 257/758 |

*Primary Examiner*—Alexander Oscar Williams
*Attorney, Agent, or Firm*—Frishauf, Holtz, Goodman, Langer & Chick, P.C.

[57] ABSTRACT

A semiconductor chip has such a structure as to have first connection electrodes formed at its upper circumferential edge portion and each exposed over a corresponding opening in a protective layer. An insulating layer is formed on the semiconductor chip except at each opening in the protective layer. Interconnect lines of an electroless-plated layer are formed on the first connection electrode. Solder bumps are formed on second connection electrodes formed together with the interconnect lines.

13 Claims, 21 Drawing Sheets

SEMICONDUCTOR DEVICE HAVING INTERCONNECT LINES AND CONNECTION ELECTRODES FORMED IN GROOVE PORTIONS OF AN INSULATING LAYER

BACKGROUND OF THE INVENTION

The present invention relates to a semiconductor device having electrode terminals arranged at a very fine pitch and a method for manufacturing the same.

In the technique of mounting a semiconductor chip, such as an LSI, called a chip size package (CSP) for instance, the semiconductor chip is mounted by a sub-circuit board to a circuit board (main circuit board), not directly on the main circuit board. In order to readily connect very fine electrode terminals of the semiconductor chip to an external electric circuit, the sub-circuit board is mounted between the semiconductor chip and the external electric circuit with the use of solder bumps provided at a wider pitch than the width between the adjacent electrode terminals of the semiconductor chip and each having a contact area greater than that of the electrode terminals of the semiconductor chip. FIG. 18 shows one form of a conventional such semiconductor device (an integral structure of a semiconductor chip and sub-circuit board). A plurality of circular holes 2 are provided in a matrix-like pattern in the substantially whole surface of a film board 1, such as polyimide, constituting the sub-circuit board. A plurality of first connection electrodes 3 are so provided on the lower surface of the film board 1 that they are plated with gold to close the respective circular holes. The plurality of first connection electrodes are electrically connected to corresponding second connection electrodes 4, respectively by corresponding interconnect lines 5.

A semiconductor chip 11 has a silicon substrate 12 covered with a protective layer 14 exposing a plurality of connection electrode terminals 13 on the silicon substrate 12.

The plurality of connection electrode terminals 13 are arranged at the upper circumferential edge portion of the silicon substrate 12 in a spaced-apart relation. The protective layer 14 of a silicon oxide or silicon nitride is formed on the whole upper surface of the silicon substrate 12 except at the central areas of the respective connection electrode terminals 13. The central areas of the connection electrode terminals 13 are exposed at the corresponding openings 15 in the protective layer 14.

The joining together of the sub-circuit board and semiconductor chip 11 will be explained below.

First, the sub-circuit board is bonded by an elastic adhesive agent 16 to the upper central area of the protective layer 14 of the semiconductor chip 11. As shown in FIG. 19, since the exposed areas of the connection terminals 13 are formed at a pitch LP which is very narrow, those second connection electrodes 4' to be connected are bent, while being depressed by a bonding tool 18 one by one, into contact with the corresponding connection electrode terminal 13 in a single point thermosonic bonding process. By the heating of the bonding tool 18, a gold-plated area melted at the surface of the second connection electrode 4 of the sub-circuit board is soon solidified to achieve a bond between the second connection electrode 4 and the connection electrode terminal 13 and hence an electrical connection between both. The pitch LP, width TW of the bonding tool 18 as viewed along the width direction of the connection electrode 4, and width LW of the connection electrode are of the order of 65 to 100 µm, 70 to 100 µm and 30 to 50 µm, respectively. The joined areas are sealed later with the resin sealing material 17 and a substantially spherical solder bump 6 is provided on the exposed areas in the circular hole 2 in the first connection electrode 3.

In the conventional such semiconductor device, use is made, as the sub-circuit board, of a 50 to 125 µm-thick film board 1 which is an additional component unit. And the film board 1 is bonded by a 50 to 100 µm-thick elastic adhesive layer 16 to the upper surface of the protective layer 14 on the semiconductor chip 11 so as to ensure adequate bondability. A resultant structure becomes considerably thicker as a whole, thus posing a problem. The elastic adhesive layer 16 has to be thickened to a given extent so as to absorb physical stress and suppress the deformation of the sub-circuit board and semiconductor chip 11. Further, the thickening of the second connection electrode 4 causes the extent of its bending to be increased at a time of a thermobonding step, so that it is vulnerable to a breakage. Also, since the second connection electrode 4 of the film board 1 is bonded to the connection electrode terminal 13 of the semiconductor chip 11, checking has to be made to see whether or not any positive bond is ensured at that area. This leads to a time-consuming problem. The second connection electrodes 4 are very fine and narrow in their pitch and, moreover, the greater in number of the second connection electrodes the lower in their throughput.

The semiconductor chip 11 has an area of its bond to the sub-circuit board exposed at its side wall and, through mechanical stress involved, a clearance is liable to be created between the protective layer 14 and the silicon substrate 12 or between the protective layer 14 and the resin sealing material 17. As a result, a moisture penetrates through the clearance and there sometimes occurs a poor conduction or conduction failure.

An object of the present invention is to provide a semiconductor device, and method for manufacturing the same, which can be made thinner as a whole without the need for providing a sub-circuit board and ensure a better yield in productivity.

Another object of the present invention is to provide a semiconductor device of better electrical performance.

BRIEF SUMMARY OF THE INVENTION

According to one semiconductor device of the present invention, an insulating layer having a surface active layer is provided between a plurality of electrode terminals of a semiconductor chip and a plurality of conductive bumps connected directly to an external electric circuit, so that interconnect lines and electrodes for connecting the electrode terminals of the semiconductor chip to the conductive bumps can be formed by an electroless plating process. For this reason, it is possible to form many electrode terminals of the semiconductor chip at a time and, in addition, to achieve better electrical connection. This obviate the necessity for making bonding checking. Since a sub-circuit board is not used, it is not necessary to provide any thick, elastic adhesive layer which has to be formed so as to stably join the semiconductor chip to the sub-circuit board. A resultant semiconductor device can be made to have a relatively thin structure.

According to another semiconductor device of the present invention, since an insulating layer covers a silicon substrate so as to protect a silicon substrate of the semiconductor chip, a moisture intrusion into electrode terminals of the silicon substrates and semiconductor chip is suppressed. Further, interconnect lines and electrodes are formed on the insulating layer so as to connect the semiconductor chip to conductive bumps. It is, therefore, not necessary to provide any elastic adhesive layer.

According to a method for manufacturing a semiconductor device of the present invention, interconnect lines and electrodes are formed directly on an insulating film on a semiconductor circuit so as to make connection between the semiconductor circuit and conductive bumps. By doing so it is possible to achieve an improved productivity without using any sub-circuit board.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION (First Embodiment)

A first embodiment of the present invention and its manufacturing method will be sequentially explained below with reference to FIGS. 1A and 1B to FIG. 6.

Figure 1A:
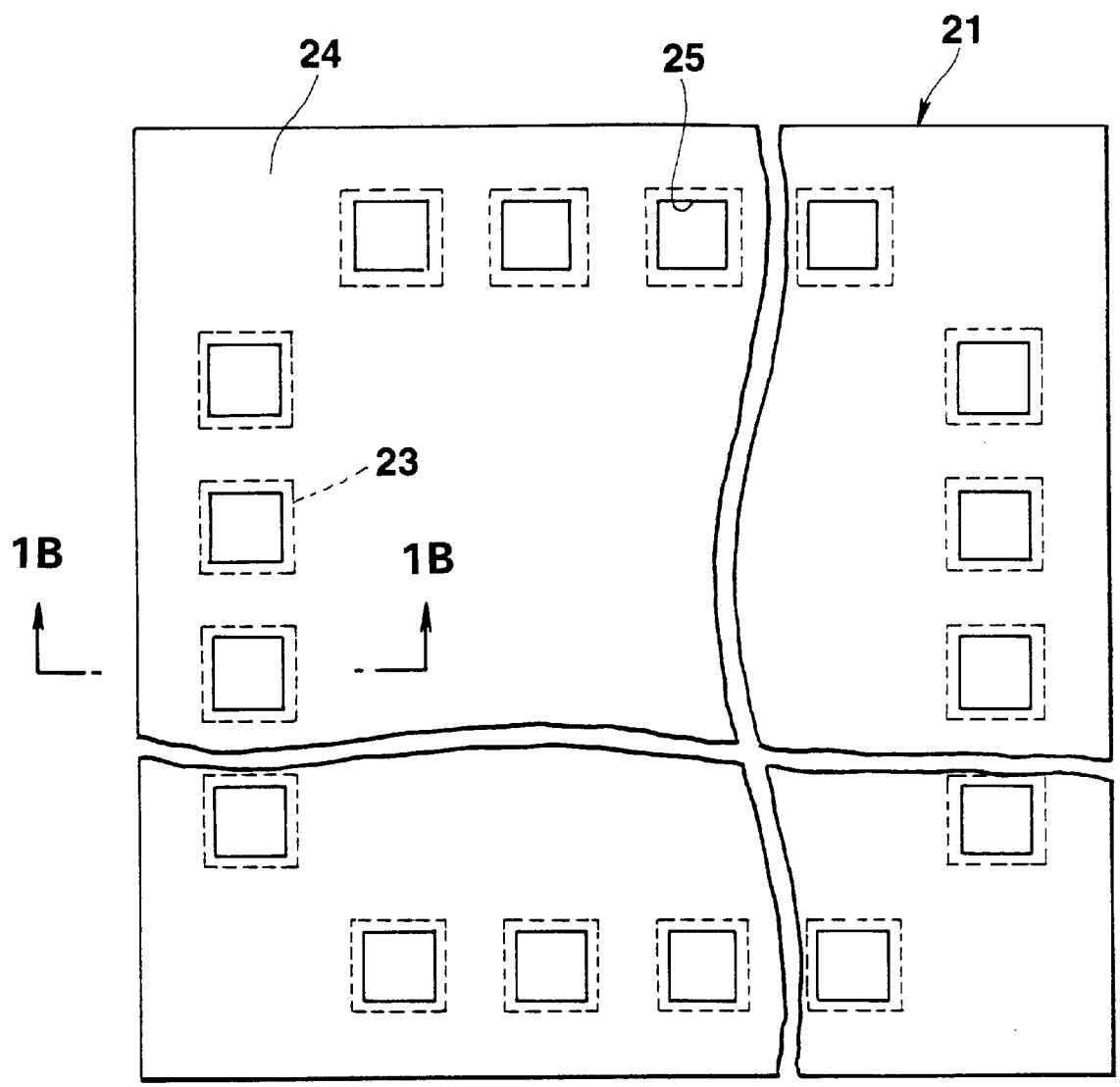
FIG. 1A is a top view of a semiconductor chip used in manufacture of a semiconductor device according to a first embodiment of the present invention.

In a semiconductor chip 21 as shown in FIG. 1A and as shown in cross-section (FIG. 1B), taken along line V—V in FIG. 1A, a plurality of first connection electrodes 23 of aluminum are arranged on and along each side of a silicon substrate 22 and a protective layer 24 of silicon oxide or silicon nitride is formed on the whole upper surface of the silicon substrate 22 except at the central area of each first connection electrode 23. The central area of the first connection electrode 23 is exposed at a corresponding opening 25 in the protective layer 24. Several tens through several hundreds of first connection electrodes 23 are arranged, as an electrode array, along each side of the semiconductor chip 21.

Figure 2:
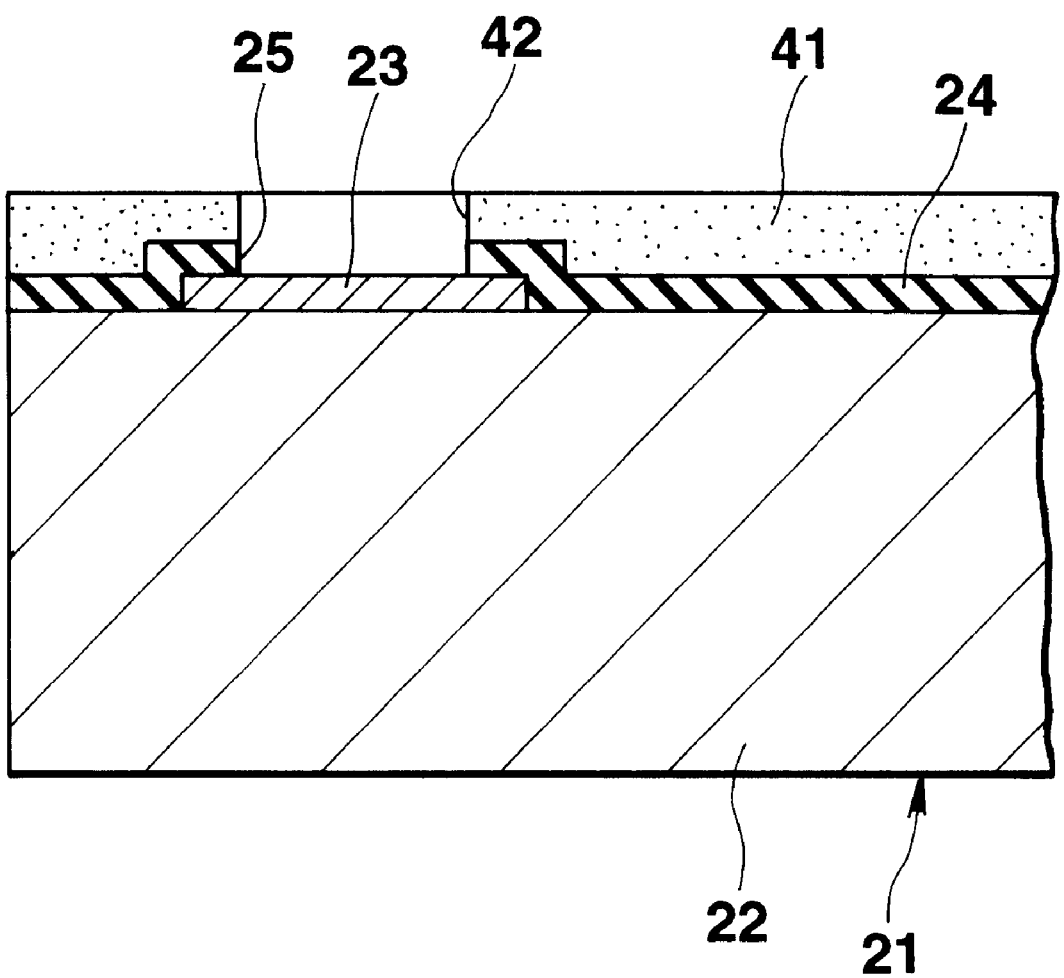
FIG. 2 is a cross-sectional view showing a manufacturing step of depositing an insulating layer in an opening.

As shown in FIG. 2, an insulating layer 41 of an epoxy resin containing a polyimide resin or carbon black is formed, by a screen process printing for instance, on the whole upper surface of the protective layer 24 except at each opening, the insulating layer being about 10 to 50 $\mu$m thick or preferably about 10 to 30 $\mu$m thick. In this state, the insulating layer 41 has an opening 42 at an area corresponding to the opening 25 of the protective layer 24.

Figure 3A:
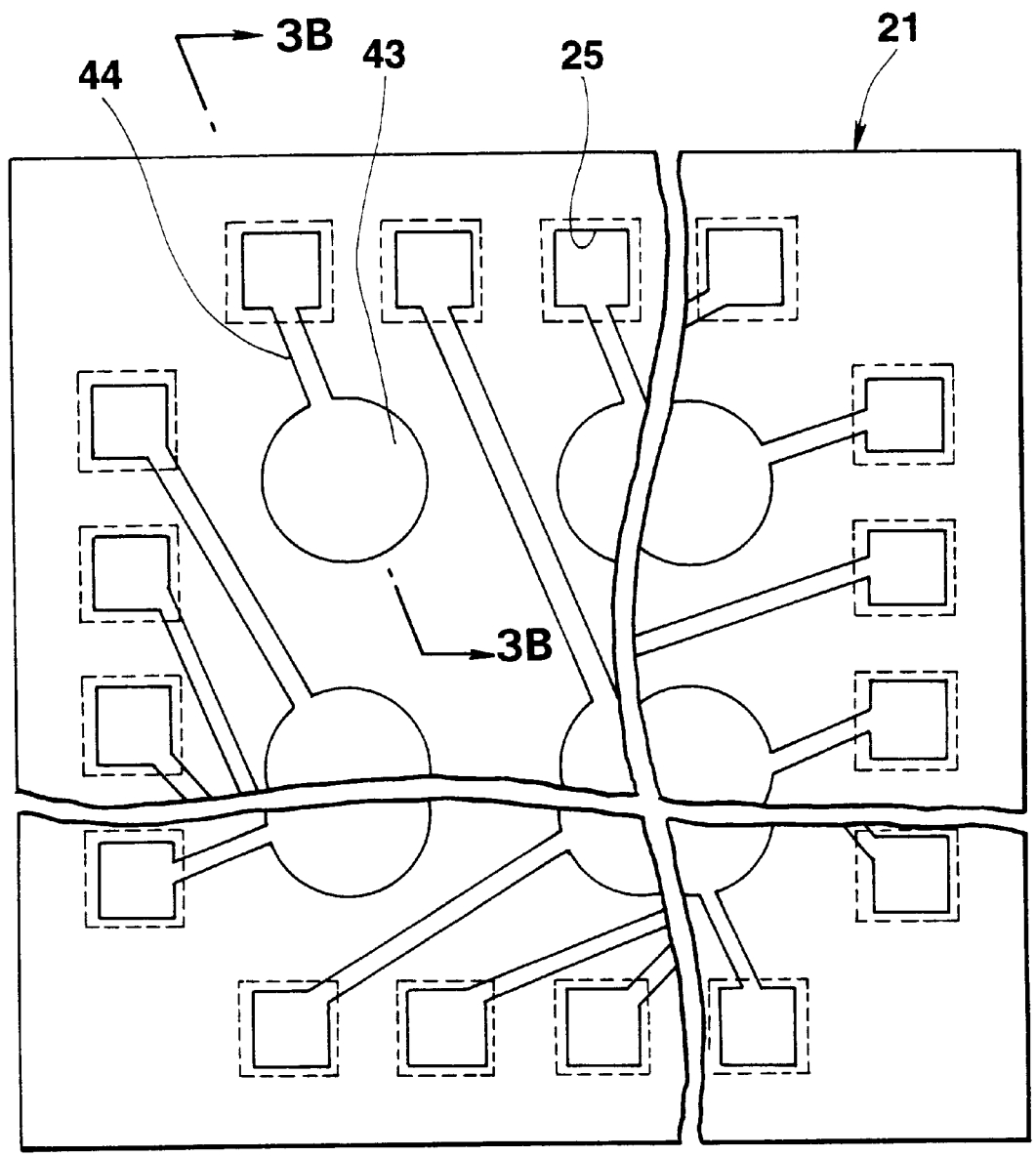
FIG. 3A is a top view showing a semiconductor chip with surface active layers formed thereon.
Figure 3B:
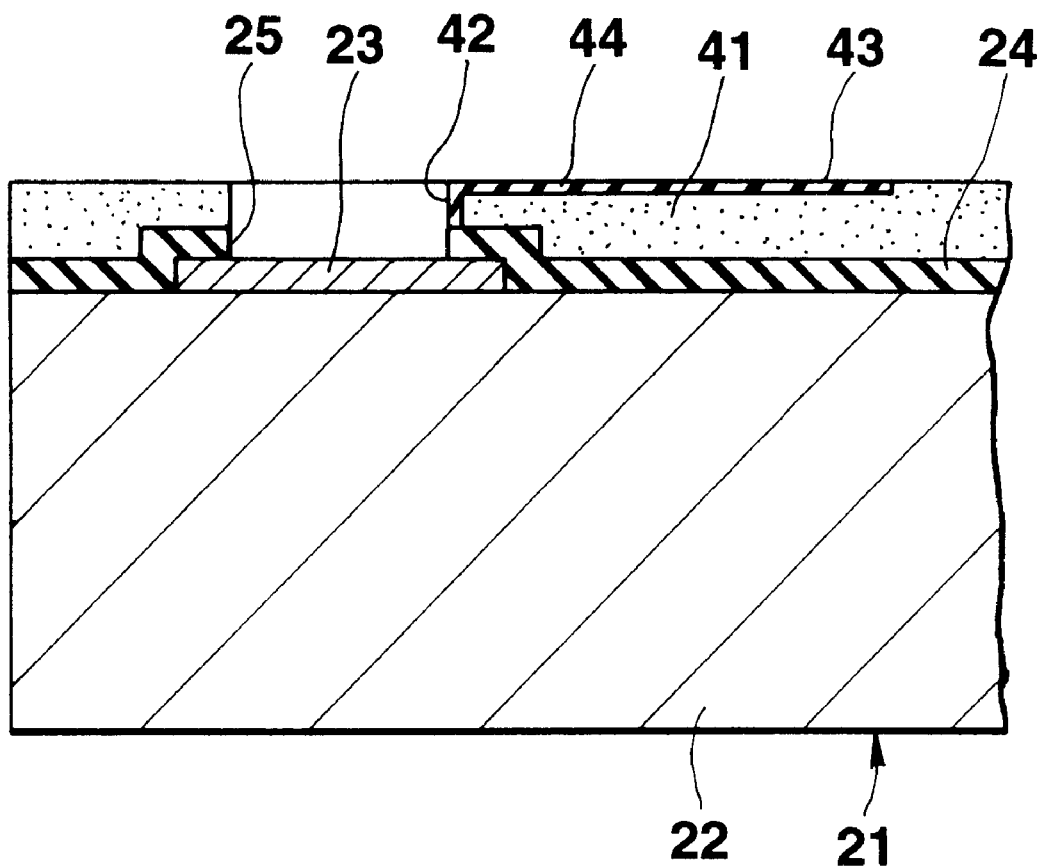
FIG. 3B is a cross-sectional view as taken along line W—W in FIG. 3A.

As shown in FIG. 3A and as indicated in FIG. 3B in a cross-section taken along line W—W in FIG. 3A, surface active layers 43 and 44 are formed on the surface of the insulating layer 41 at predetermined areas through a scanning with a laser beam coming from an excimer laser. That is, those surface active layers 43 for a plurality of circular connection electrodes are formed on the surface of the insulating layer 41 at those areas surrounded with the first connection electrodes 23 to provide a matrix-like array or uniformly spaced-apart array. Those surface active layers 44 for plural connection are so provided as to connect those opening (25, 42) areas in the protective layers and insulating layers 41 to corresponding surface active layers 43 for the second electrodes.

Here, an irradiation with a laser beam from the excimer laser in this case will be explained below in more detail. Since, in a KrF excimer laser case, a light energy is about 50 eV, it is possible to easily break a C—C bond (3.5 eV), C—H bond (4.3 eV) and C═O bond which are the basic bonds of high polymer materials as the material of the insulating layer 41. Further, the oscillation pulse width is very short on the order of about 10 nm and it is, therefore, possible to reduce heat diffusion. The wavelength of the laser beam of the excimer laser is as short as 0.248 $\mu$m and, since the polyimide resin and carbon-containing epoxy resin readily absorb that wavelength, their intermolecular bond is easier to break. Further, the thickness of the surface active layer can be better controlled to be made thinner. As understable from the above, the surface property of the insulating layer 41 changes from a hydrophobic to a hydrophilic one and, when the surface side of the insulating layer 41 is made active, the surface works fine under a low heat damage.

Figure 4:
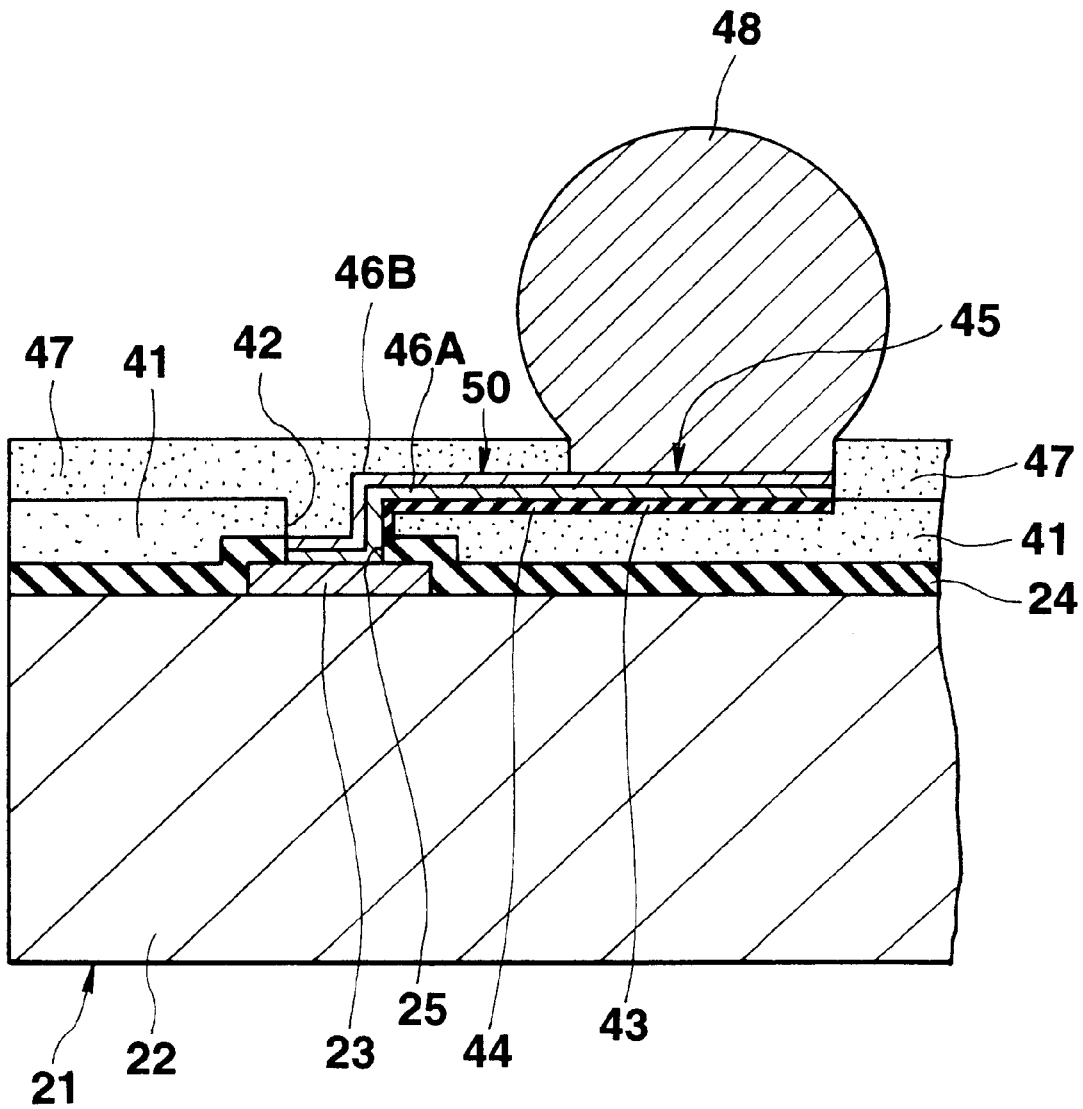
FIG. 4 is a cross-sectional view showing a manufacturing step of forming a solder bump on a second semiconductor electrode.

Then, for conductivity enhancement, a native oxide layer, not shown, on the surface of the first connection electrode 23 of aluminum is removed with an HF- or phosphoric acid-series etching solution. Then, as shown in FIG. 4, through the electroless plating of zinc, nickel, etc., smaller in ionization tendency than aluminum, a first conductive layer 46A for adhesive bond is thinly formed, as a few $\mu$m-thick layer, on the surface of the first connection electrode 23 and those of the surface active layers 43, 44. Then through the electroless plating of copper, etc., smaller in ionization tendency than zinc and nickel, a second conductive layer 46B is formed on the first conductive layer 46A. By doing so, a second connection electrode 45 is formed on the surface of the surface active layer 43 for the second connection electrode and an interconnect line 50 is formed on the surface of the first connection electrode 23 and on that of the surface active layer 44 for interconnection. In this state, the first connection electrode 23 and second connection electrode 45 are electrically connected together through the interconnect line 50. The first conductive layer 46A can be easily formed on the surface of the surface active layers 43, 44 through the action of these surface active layers. A third conductive layer for oxidation prevention may be formed on the surface of the second conductive layer 46B through the electroless plating of Au smaller in ionization tendency than the material of the second conductive layer 46B.

Figure 5:
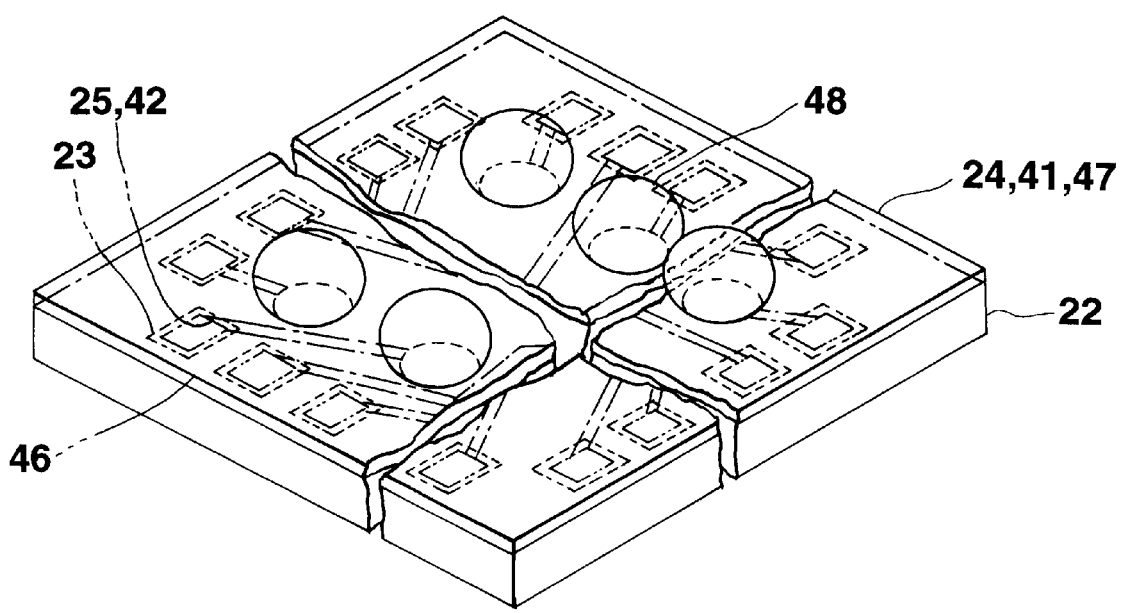
FIG. 5 is a perspective view partly corresponding to that of the device of FIG. 4.

Then a resin, such as an epoxy-, polyimide-, etc., series resin, is coated, by the screen process printing, etc., on the whole upper surface of a resultant structure except at the second connection electrode 45 to provide a protective layer 47. The protective layer 47 protects the surface of the interconnect line 50 and serves as a wall for preventing a solder flow at a time of forming a solder bump as will be explained below. The thickness of the protective layer, even if being below about 10 $\mu$m on the interconnect line 50 over the surface active layer 44, ensures an adequate function. After a solder ball being solid-like in atmospheric temperature has been placed on the second connection electrode or after a solid paste melted at atmospheric temperature has been printed thereon, it is reflowed to provide a substantially spherical solder bump 48. As shown in FIG. 5, a semiconductor device according to the first embodiment of the present invention is manufactured in this way.

Figure 6:
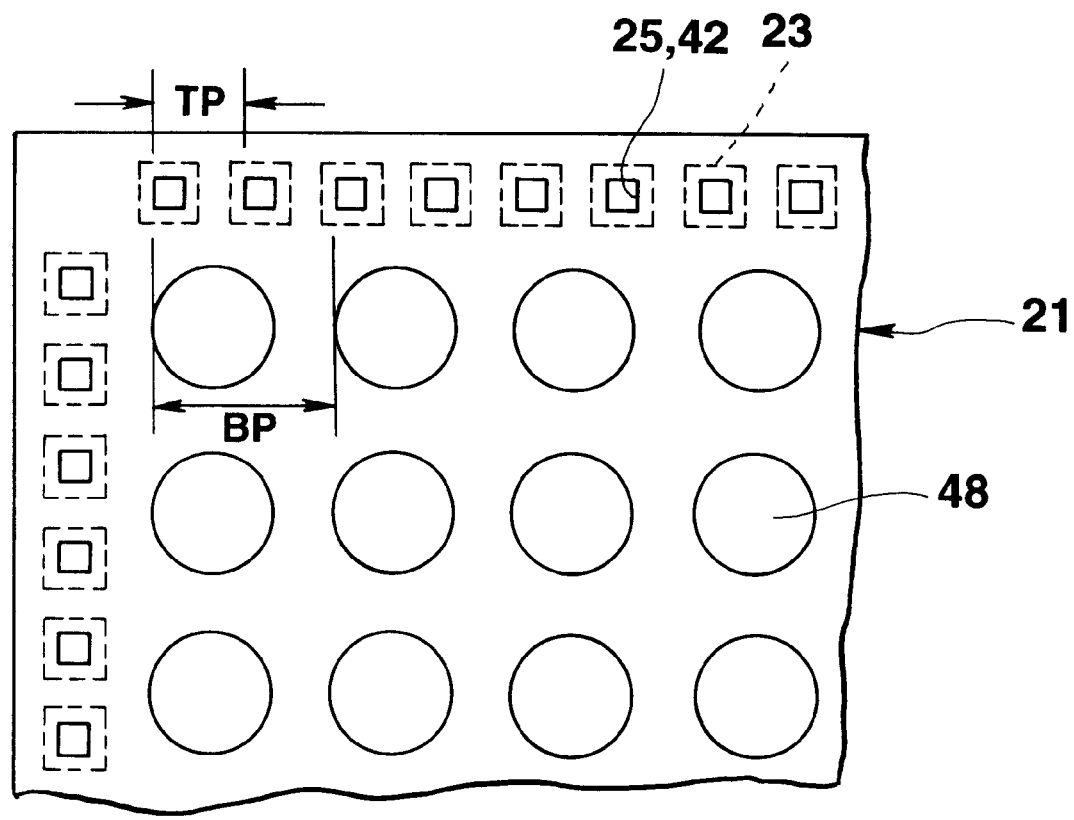
FIG. 6 is a top view showing the semiconductor device in FIG. 5.

As shown in FIG. 6, the solder bump 48 is so configured as to make a connection area which is involved at a time of making connection to the corresponding terminal on an external electrical circuit greater than the opening area of the first connection electrode 23 at the openings 25, 42 and to make the pitch BP between the adjacent solder bumps 48 longer than the pitch TP of the openings 25, 42. It is, therefore, possible to make readier connection to terminals on the external electrical circuit and also to achieve an excellent bondability.

In the case where 100 first connection electrodes 23 are arranged on one side of a silicon substrate 22 of a semiconductor chip 21 of a rectangular configuration, 400 first connection electrodes 23 and solder bumps 48 are respectively provided in total numbers. According to the semiconductor device structure of the present embodiment, since those solder bumps 48 on the second connection electrodes 45 are arranged as a matrix array around the four sides of an array of the first connection electrodes 23, 20 second connection electrodes 45 and solder bumps 48 have only to be arranged relative to each side of the first connection electrode array, so that it is possible to make the pitch BP between the mutually adjacent solder bumps 48 very larger.

In the semiconductor device thus obtained, no sub-printed circuit board is used and the insulating layer 41 and protective layer 47, being combined together, are of the order of a few tens of $\mu$m thick, so that a whole device structure can be made thinner.

Since no elastic bonding layer 15 is used, the second connection electrode 45 and interconnect lines 50 are not floated in the air during process and there arises almost no connection position displacement which may be encountered in the prior art during a thermal pressure bonding. Further, the interconnect lines 50 are formed on the first connection electrode 23 of the semiconductor chip 21 by the electroless plating process to provide a double layer structure. It is, therefore, possible to positively join the interconnect line 50 to the first connection electrode 23, simultaneously with the formation of the second connection electrode 45 and interconnect line 50, and to obviate the need to make bond checking.

Since all the second connection electrodes 45 and interconnect lines 50 are formed at a time through the use of the electroless plating process, it is possible to manufacture a semiconductor device in better throughput. Since the surface active layers 43, 44 are formed by scanning with the laser beam coming from an excimer layer, they can be formed very fine with a narrow width. Further, in the electroless plating process, the first conductive layer 46A is nearly not deposited on the hydrophobic portion of the insulating layer 41 and the first conductive layer 46A can be formed only on the surface of the surface active layers 43, 44. It is, therefore, possible to form the interconnect lines 50 very fine with a narrow width in accordance with a scan pattern of the excimer laser beam.

Figure 7:
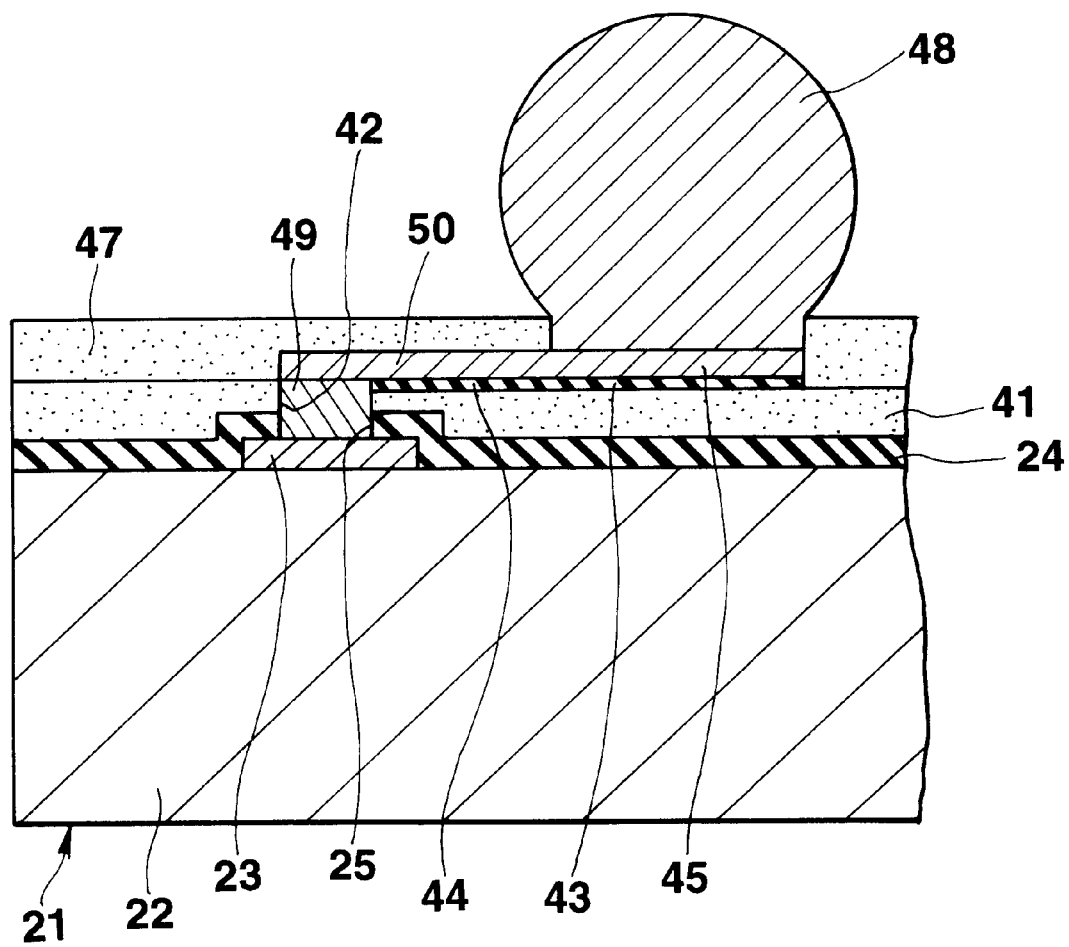
FIG. 7 is a cross-sectional view showing a semiconductor device with an interconnect line on an interlayer.
Figure 8:
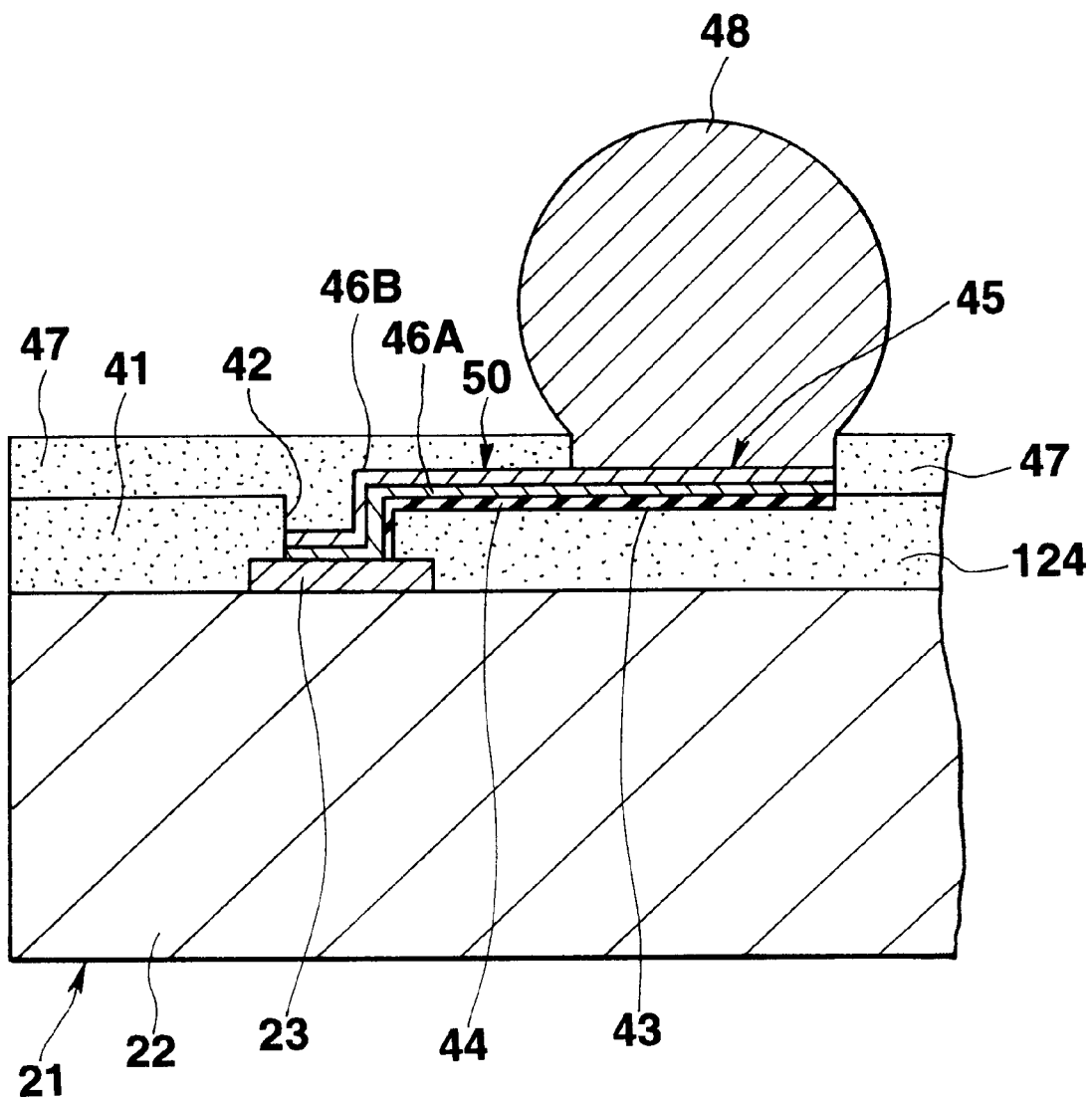
FIG. 8 is a cross-sectional view showing a semiconductor device with an interconnect line formed over an insulating layer of a semiconductor chip.

In the first embodiment, the surface active layers 43, 44 as shown in FIG. 3A are formed by scanning with the laser beam coming from the excimer laser. However, the method is not restricted thereto. Since, in the first embodiment, the insulating layer 41 is formed over the upper surface only of the semiconductor chip 21, the surface active layers 43, 44 may be formed by a one-at-a-time irradiation method using a mask of a given pattern. Although, in the first embodiment, the interconnect lines 50 are formed over the first connection electrode 23 as shown in FIG. 4, the present embodiment is not restricted thereto. A device structure may be formed as follows. As shown in FIG. 7 for instance, after an insulating layer 41 has been formed, an interlayer 49 is formed in openings 25, 42 in the insulating layers 24, 41 by an electroless plating with zinc, nickel, etc., and then surface active layers 43, 44 are formed, followed by the formation of a metal layer over the interlayer 49 and surface active layers 44, 43 and followed by the formation of a connection electrode 45 formed of a metal layer and formation of an interconnect lines 50 formed of the interlayer 49 and metal layer. The metal layer can be readily formed by an electroless plating if it is formed of a metal material, such as copper, smaller in ionization tendency than that of the interlayer 49. A still thinner semiconductor device can be provided over a semiconductor chip 21 as shown in FIG. 8 by forming surface active layers 43, 44 directly on the surface of a protective layer 124 formed of an about 10 to 30

μm-thick polyimide series resin or epoxy resin containing a carbon black, etc., in which case the protective layer 124 is used in place of the protective layer 24 formed of oxide silicon or silicon nitride.

(Second Embodiment)

Figure 1B:
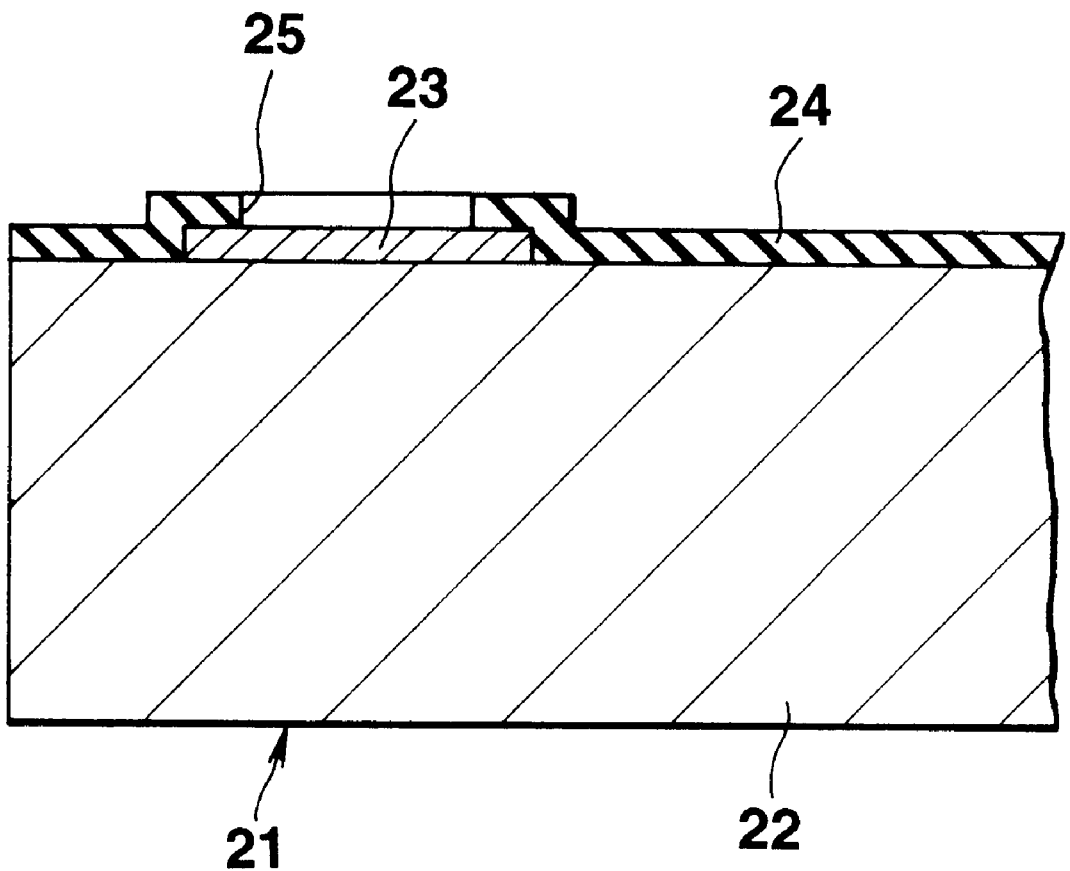
FIG. 1B is a cross-sectional view as taken along line V—V in FIG. 1A.
Figure 9:
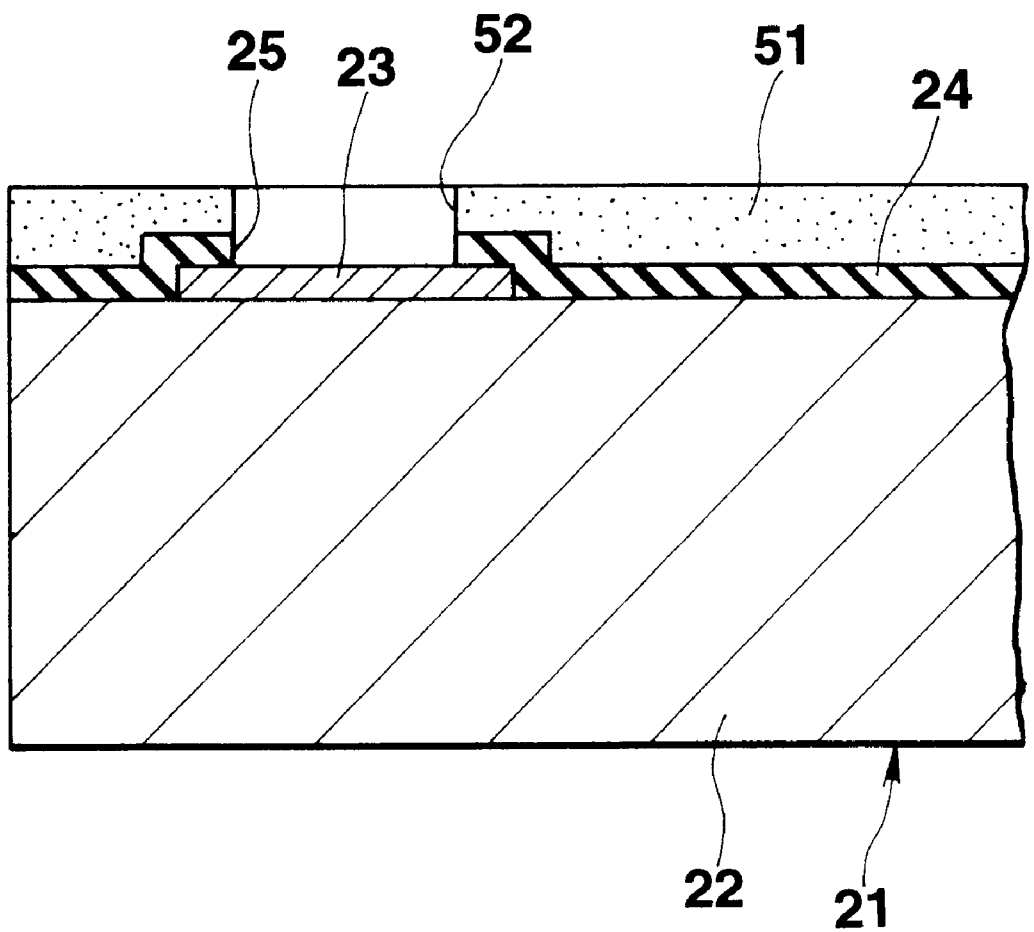
FIG. 9 is a cross-sectional view showing a manufacturing step of forming an opening-formed first insulating layer over the semiconductor chip.

A method for manufacturing a semiconductor device according to the second embodiment of the present invention will be explained below with reference with FIGS. 9 to 11. Even in the second embodiment, a semiconductor chip 21 as shown in FIGS. 1A and 1B is first prepared in the case of the first embodiment. As shown in FIG. 9, an about 10 to 30 μm-thick first insulating layer 51 formed of a polyimide series resin for instance is formed by the screen process printing on the upper surface of a protective layer 24 except at an opening 25. In this state, an opening 52 is formed in the first insulating layer 51 at an area corresponding to an opening 25 in the protective layer 24.

Figure 10:
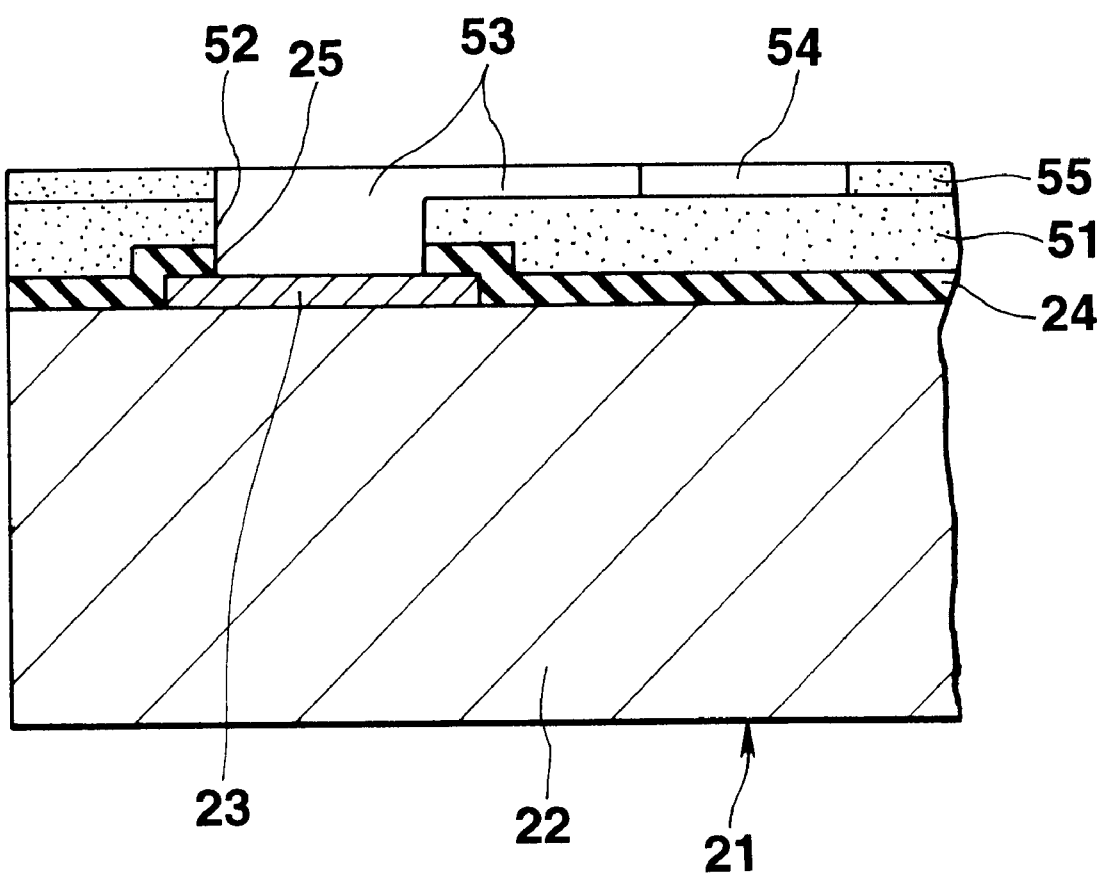
FIG. 10 is a cross-sectional view showing a manufacturing step of forming a second insulating layer over the upper surface of the first insulating layer except at an interconnect line forming area and second connection electrode forming area.
Figure 11:
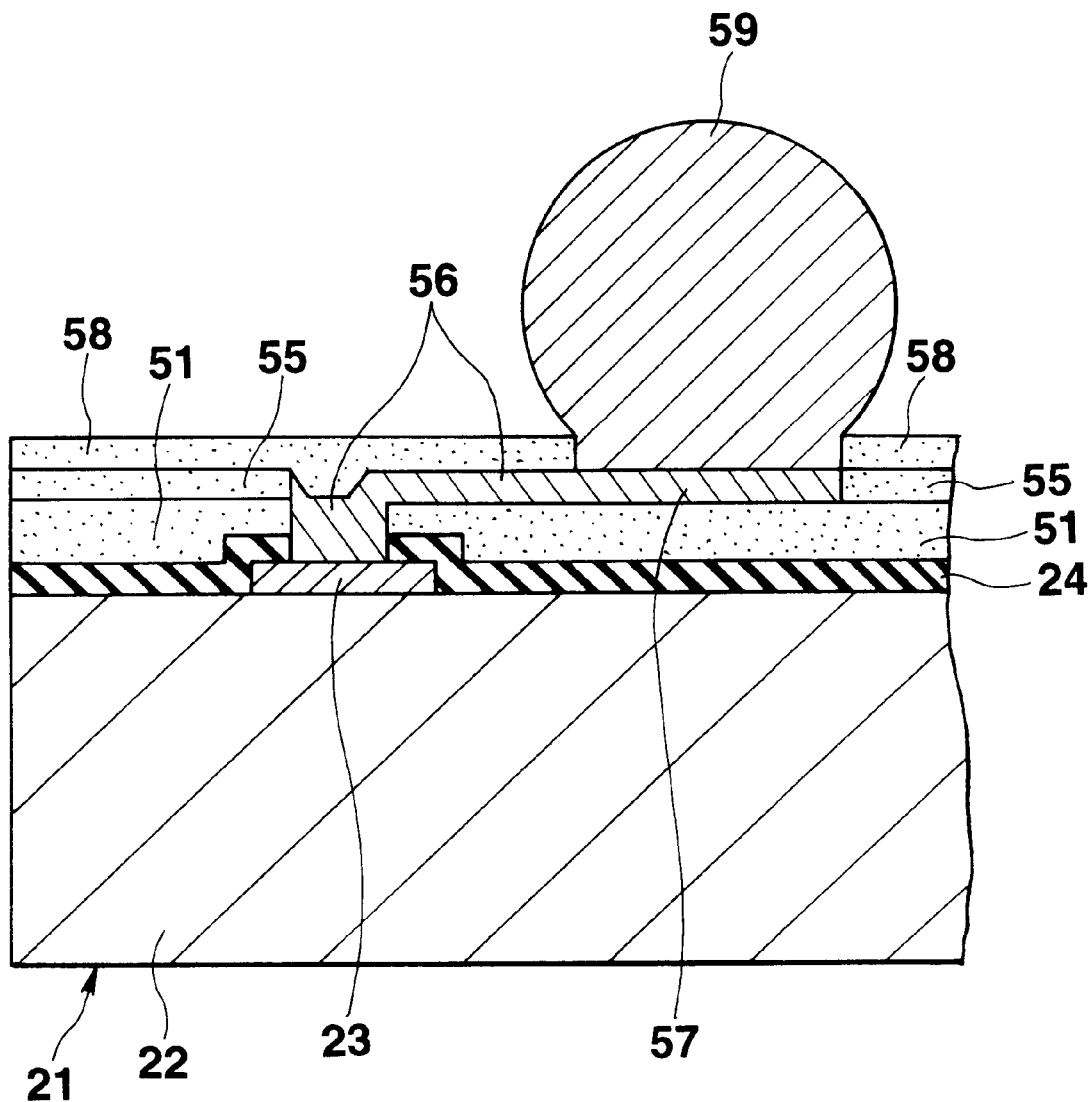
FIG. 11 is a cross-sectional view showing a manufacturing step of forming a solder bump on a second connection electrode.

As shown in FIG. 10, an about 10 to 30 μm-thick second insulating layer 55 formed of a polyimide series resin for instance is formed on the whole surface of the first insulating layer 51 except at a connection formation area 53 including an exposure surface of the first connection electrode 23 and except at the second connection electrode forming area 54. A pattern as seen on the connection formation area 53 and second connection electrode formation area 54 has the same configuration as the pattern of the openings 25 and surface active layers 43, 44 as shown in FIG. 3A.

In this state, a plurality of second connection electrode formation areas 54 constituting a plurality of circular openings are formed as a matrix-like or uniformly spaced-apart array in an area of a plurality of first connection electrodes 23 in the second insulating layer 55. Next, the connection formation areas 53 constituting a plurality of openings are provided to connect the openings 25, 52 of the protective layer 24 and first insulating layer 51 to the second connection electrode formation area 54. In this connection it is to be noted that the second insulating layer 55 serves simply as a wall for preventing a conductive paste from flowing out at a time of coating this conductive paste as will be explained below and that the second insulating layer may be of the order of 10 μm thick.

Then the first connection electrode 23 of aluminum has its surface native oxide layer (not shown) eliminated with an HF- or phosphoric acid-series etchant. As shown in FIG. 11, interconnect lines and second connection electrodes 57 are provided by coating the conductive paste (for example, a paste containing metal particles such as silver) on the connection formation area 53 and second connection formation area 54 by the screen process printing, etc. In this state, the first connection electrode 23 is connected by the interconnect line 56 to the second connection electrode 56. The interconnect formation area 53 and second insulating layer 55 can be readily provided even if use is made of surface active layers 43, 44 as in the case of the first embodiment. In the case where the second insulating layer 55 is formed of polyimide, the curing temperature after the coating has been done is of the order of 300 to 350° C. and the baking time is about 60 to 90 minutes. The curing temperature for the conductive paste is of the order of below 200° C.

Then an epoxy- or polyimide-series resin for instance is coated, by a screen process printing, etc., on a whole upper surface except at the second connection electrode 57 to provide a protective layer 58. The protective layer 58 protects the surface of the interconnect lines 56 and serves as a wall for preventing the flowing out of a solder at a time of forming solder bumps as will be set out below. The thickness of the protective layer 58 is adequate even on the order of below 10 μm on the interconnect lines 56 overlying the first insulating layer 51. By mounting solder balls, or printing a solder paste, on the second connection electrode 57 followed by reflowing, it is possible to provide substantially spherical solder bumps 59. By doing so, it is possible to manufacture a semiconductor device according to the second embodiment of the present invention.

Even in the semiconductor device thus obtained, the total thickness of the first insulating layer 51, second insulting layer 55 and protective layer 58, being put together, can be made to be of the order of 100 μm, so that the resultant semiconductor device structure can be made thinner. Further, the interconnect lines 56 are formed on the first connection electrode 25 and it is, therefore, possible to positively join the interconnect lines 56 to the first connection electrode 23 simultaneously with the formation of the second connection electrode 57 and interconnect lines 56 and hence to eliminate the need for making bond checking. And the first insulating layer 51, etc., are formed over the upper surface alone of the semiconductor chip 21 and it is thus possible to, in this wafer state, effect a device formation process up to the "solder bump" step. Further, since the second connection electrode 57 and interconnect lines 56 are formed by the screen process printing for instance, it is possible to more simplify the formation of a semiconductor device structure than by the electroless plating method. Even in the second embodiment, as shown in FIG. 8, use is made of, as the semiconductor chip 21, one having an insulating protective layer 124 instead of the protective layer 24 of silicon oxide or silicon nitride, the insulating protective layer 125 being about 10 to 30 μm thick and being formed of a polyimide- or an epoxy-series resin containing a carbon black, etc. By doing so, it is possible to form a semiconductor device of a still thin structure if the interconnect lines 56 and second connection electrode 57 are formed over the surface of the protective layer 124 and connection electrode terminals 23 of the semiconductor chip 21.

(Third Embodiment)

A method for manufacturing a semiconductor device according to the third embodiment of the present invention will be explained below with reference to FIGS. 12 to 17.

Figure 12:
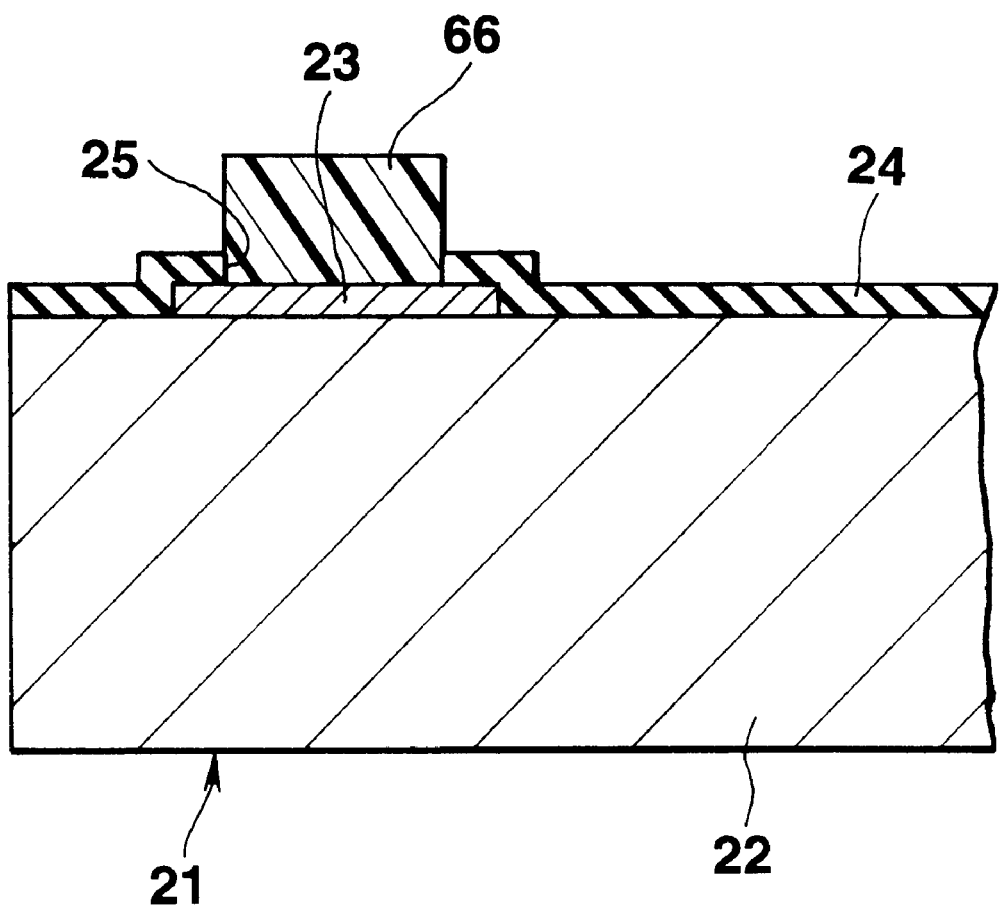
FIG. 12 is a cross-sectional view showing a manufacturing step for forming a projection on the first connection electrode.

As shown in FIG. 12, a projection 66 of a polyimide-series resin, etc., is formed on an exposed surface of a connection electrode terminal 23 on a semiconductor chip 21 at an area corresponding to an opening 25 in the protective layer 24 by a low pressure printing, etc.

Figure 13:
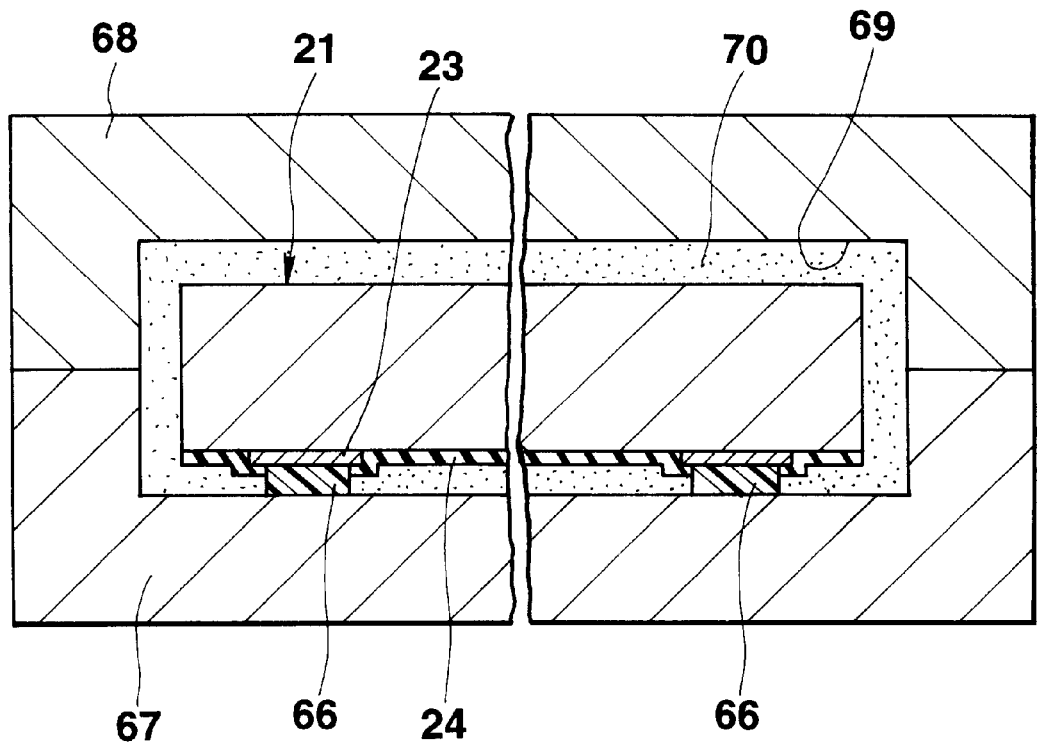
FIG. 13 is a cross-sectional view showing a manufacturing step of filling a resin in a cavity between upper and lower mold halves.

As shown in FIG. 13, a resultant semiconductor chip structure is placed in a lower mold half 67 with its projection 66 down and then an upper mold half is covered on the lower mold half 67 to close a mold. In this state, a cavity 69 is so dimensioned as to be defined around a whole circumference of the semiconductor chip 21 at a given spacing corresponding to the height of the projection 66. Then an epoxy- or a polyimide-series resin containing a carbon black, etc., is filled in the cavity 69 in the mold to provide an insulating layer 70 around the whole surface of the semiconductor chip 21.

Figure 14:
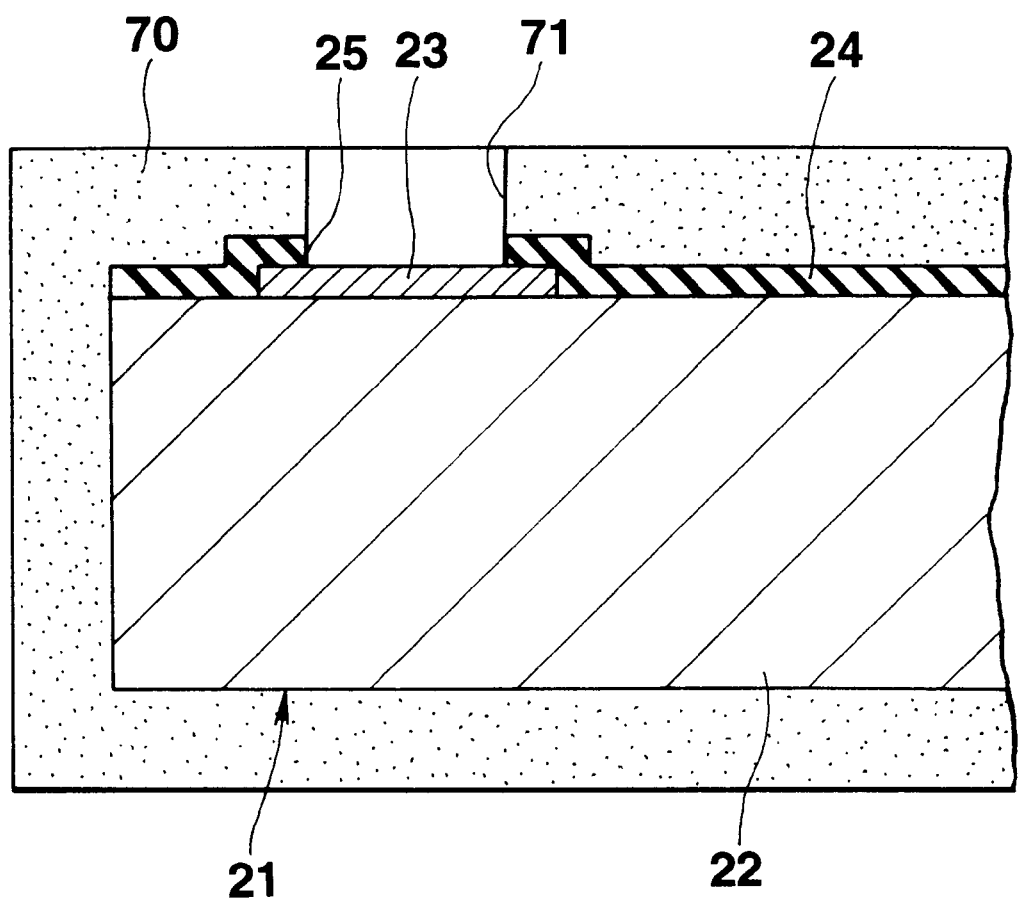
FIG. 14 is a cross-sectional view showing a manufacturing step of removing the projection.

Then the projection 66 is removed from the semiconductor chip structure by a photolithography process using a resist mask of a given pattern not shown. By doing so, an opening 71 is formed in the insulating layer 70 at an area corresponding to the opening 25 of the protective layer 24 as shown in FIG. 14. In this state, the center area of the first connection electrode 23 is exposed at those areas corresponding to the opening 25 of the protective layer 24 and opening 71 of the insulating layer 70.

Figure 15:
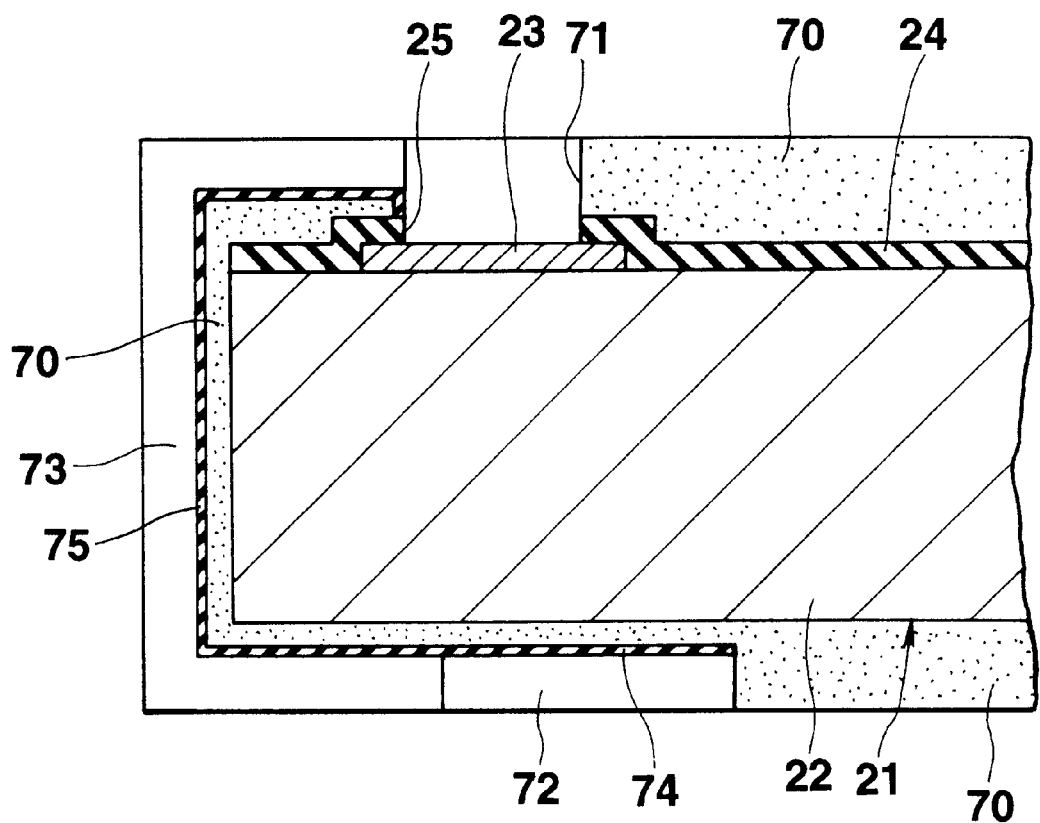
FIG. 15 is a cross-sectional view showing a manufacturing step of forming grooves in the upper, side and lower surfaces of the insulating layer.

A plurality of circular recesses 72 for a second connection electrode are provided as a matrix-like pattern on a surface side of the insulating layer 70 formed on the lower surface of the semiconductor chip 21 as shown in FIG. 15. A plurality of grooves 73 are provided in those surface sides of the insulating layer 70 formed at the upper, side and lower surfaces sides of the semiconductor chip 21 so as to have those openings 25, 71 in the protective layer 24 and insulating layer 70 correspond to the recesses 72 for second connection electrodes.

The recess 72 and groove 73 are formed by the following method. That is, when those given surface areas of the insulating layers 70 formed at the upper, side and lower surfaces of the semiconductor chip structure are scanned with a laser beam from an excimer laser, a resin's molecular bond is broken in the surface side of the insulating layer 70 at those beam-irradiated areas, thus causing the surface side of the insulating layer 70 at the irradiated areas to be etched. By doing so, the grooves/recesses 72, 73 are so formed as to have a few tens of $\mu$m in depth. The grooves 73 for interconnection are normally of the order of below 100 $\mu$m in width, though depending upon the size of the semiconductor chip 21, number and pitch of the connection electrodes.

In place of the excimer laser use may be made of a $CO_2$ laser and YAG laser. However, the shorter the wavelength of the laser beams the better, so that the excimer laser is the most preferred. The reason is because, for a shorter length, less thermal damage occurs when the surface side of the insulating layer 70 is etched and it is, therefore, possible to form a well-shaped grooves/recesses 73, 72. Further, for the case of the excimer laser, the grooves/recesses become rougher at their bottom surfaces and the surfaces of their bottoms change from hydrophobic to hydrophilic to provide surface active layers 74, 75 on the bottom surfaces of the grooves/recesses. The reason for the formation of the surface active layers 74, 75 is because the electroless plating areas can be formed for electroless plating to be done as will be set out below. For the case of the $CO_2$ laser and YAG laser, on the other hand, the grooves/recesses 73, 72 are merely formed and then the laser beam coming from the excimer laser is irradiated there to cause the bottom surface property of these grooves/recesses to becomes hydrophobic to hydrophilic. In this case, the irradiation width of the excimer laser beam is made equal to, or less than, the width of these grooves/recesses.

Figure 16:
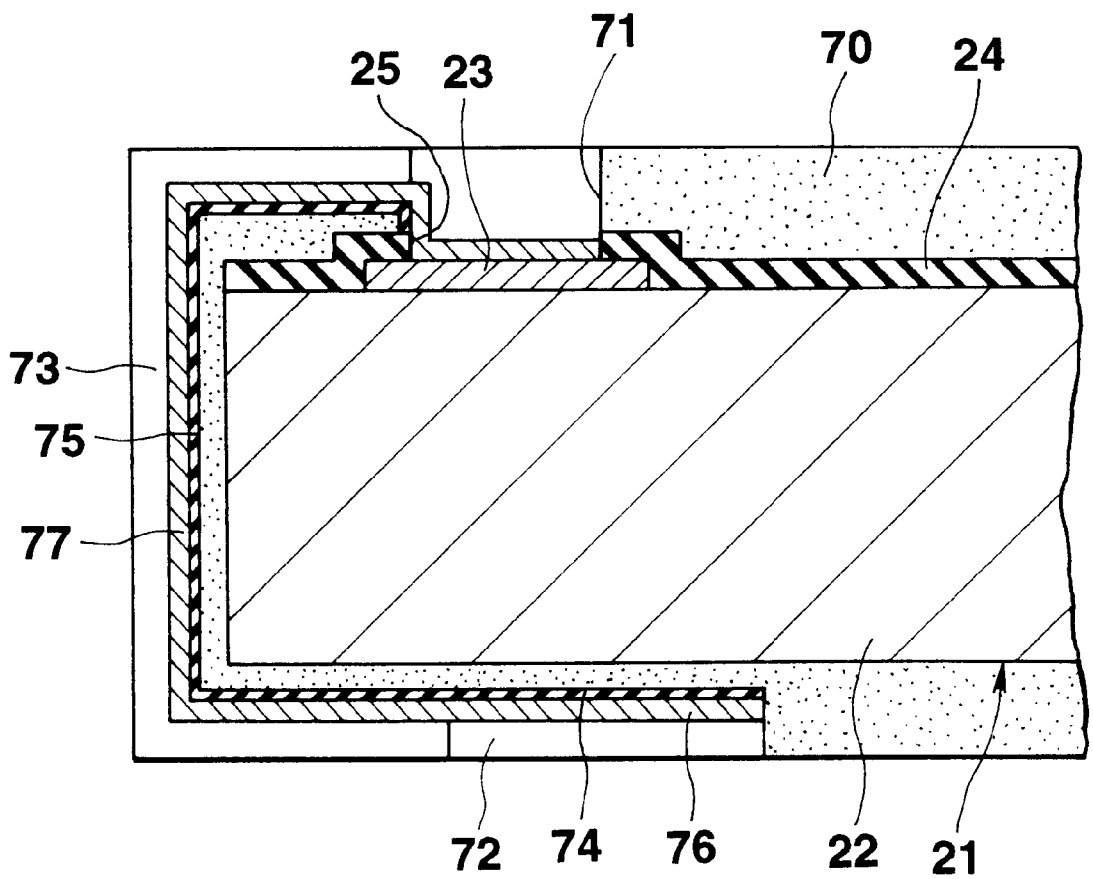
FIG. 16 is a cross-sectional view showing a manufacturing step of forming interconnect lines in the grooves.

Then a native oxide layer (not shown) on the surface of the first connection electrode 23 of aluminum is eliminated with an HF- or a phosphoric acid-series etchant. As shown in FIG. 16, through the electroless plating of nickel, etc., a second connection electrode 76 of a metal-plated layer is formed on the surface of the surface active layer 74 in the recesses 72 and interconnect lines 77 of a metal-plated layer are formed on the surface of the first connection electrode 23 and on the surface of the surface active layer 75 in the groove 73. In this case, the first connection electrode 23 is electrically connected by the interconnect line 77 to the second connection electrode 76.

Figure 17:
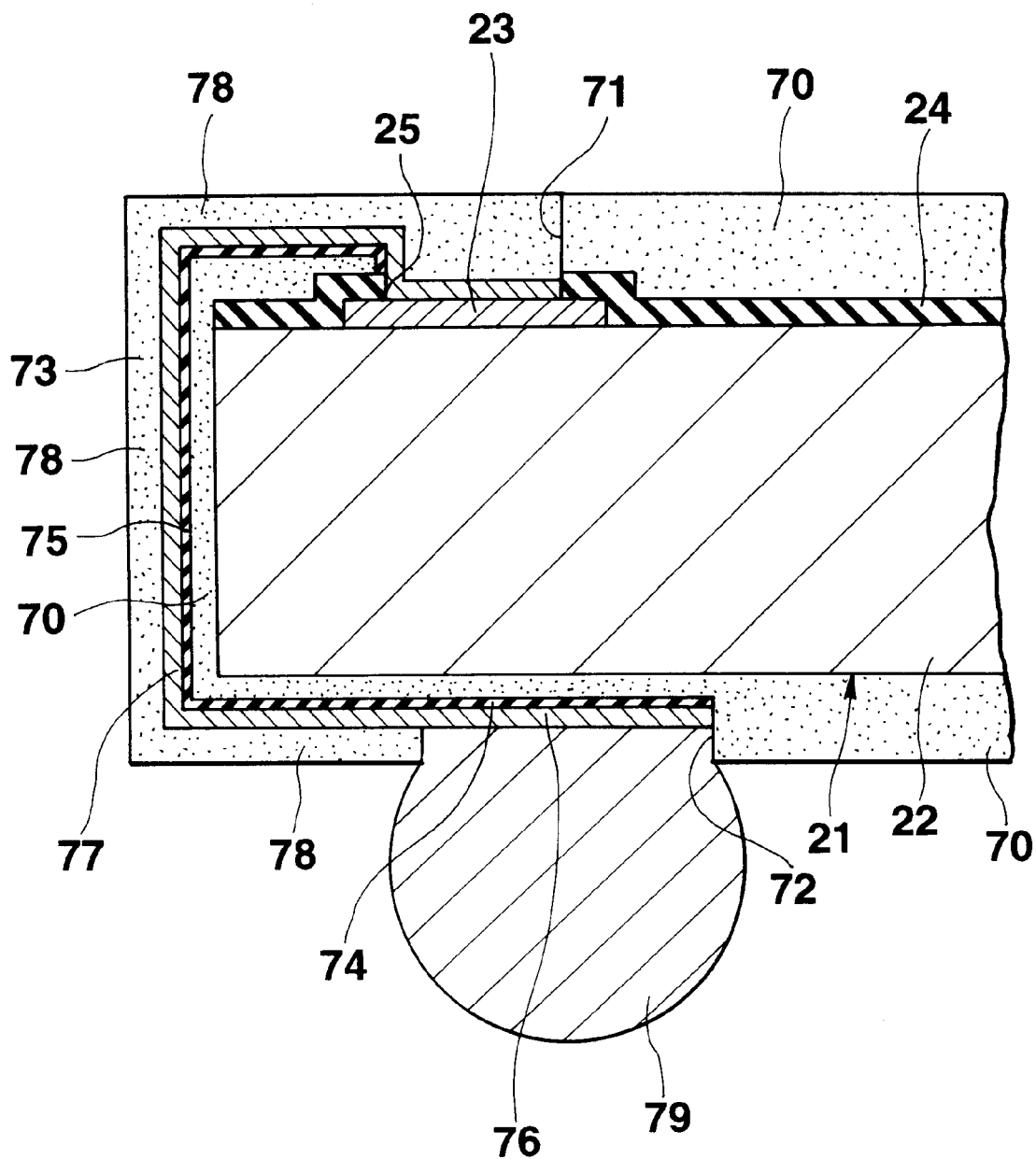
FIG. 17 is a cross-sectional view showing a manufacturing step of forming a solder bump over a second connection electrode.
Figure 18:
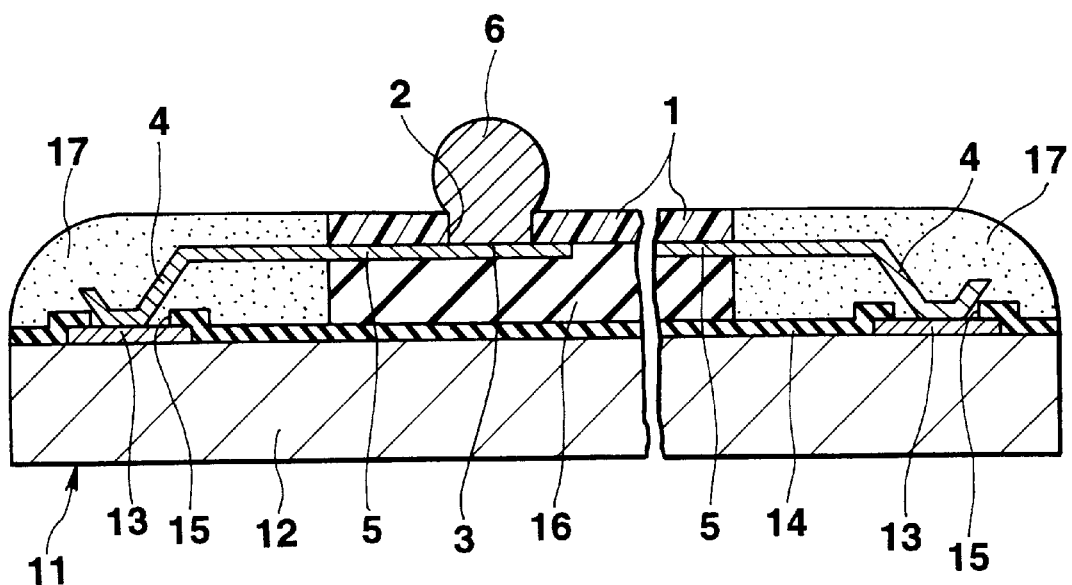
FIG. 18 is a cross-sectional view showing one form of a conventional semiconductor device.
Figure 19:
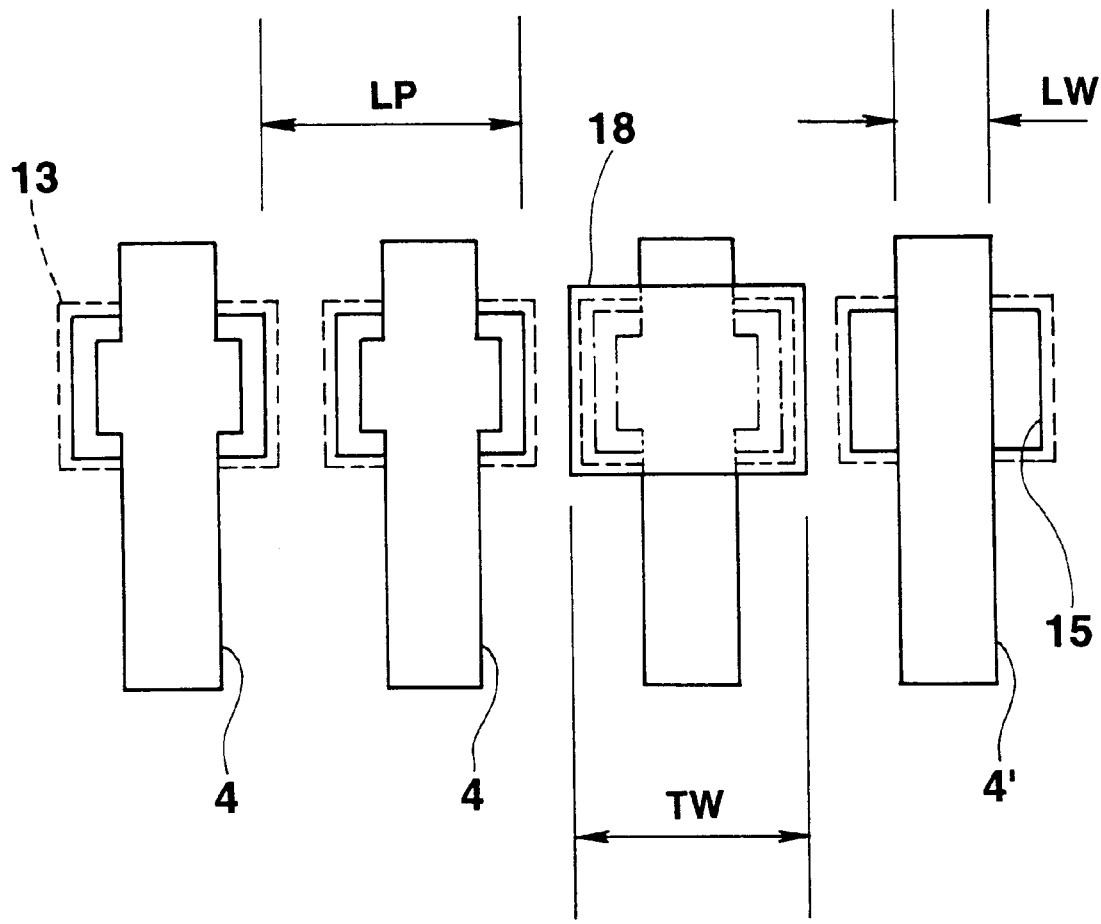
FIG. 19 is a top view for connecting together second connection electrodes and connection electrode terminals.

As shown in FIG. 17, an epoxy- or a polyimide-series resin for instance is coated by a dispenser, etc., in openings 25, 71 of the protective layer 24 and insulating layer 70 and in the grooves 73 for interconnection to provide a protective layer 78. The protective layer 78 not only protects the surface of the interconnect lines 77 but also serves as a wall for preventing a flowing out of a solder at a time of forming a solder bump as will be set out below. Then, a solder ball is placed on the corresponding second connection electrode 76, or printing is made with a solder paste, and a substantially spherical solder bump 79 is formed through a reflowing step. Thus it is possible to manufacture a semiconductor device according to a third embodiment of the present invention.

Since, in the semiconductor device thus obtained, all the second connection electrodes 76 and interconnect lines 77 are formed by the electroless plating process at a time, thus enabling the semiconductor device to be manufactured in a better throughput.

Further, it is also possible to closely form the recesses/grooves (72, 73), as well as the surface active layers 74, 75 on the surfaces of these recesses/grooves, through the use of the laser beam from the excimer laser. By the electroless plating process, the interconnect lines 77 can be formed in accordance with a scanning pattern of a laser beam from an excimer laser, so that they can be made very fine and narrow in their configuration. In the first to third embodiments, although the insulating layers 41, 70, 124 may contain the epoxy resin containing a carbon black, etc., use may be made of an epoxy resin not containing any carbon black for instance so long as the epoxy resin is of such a type as to adequately absorb the laser beam from the excimer laser. So long as the laser beam is shorter in irradiation wavelength and easily absorbable into the insulating layers 41, 70, 124, it may be possible to form the surface active layer by not only the excimer laser beam but also other proper laser beams.

The second connection electrode 76 and interconnect lines 77 are formed on the surface side of the insulating layer 70 covering the upper, side and lower surfaces of the semiconductor chip 21 and, in addition, any sub-circuit board as a different component unit is not used, so that it is possible to provide a whole semiconductor device structure of a thinner type. In this case, the thickness of the insulating layer 70 underlying the second connection electrode 76 and interconnect lines 77 can be made as thin as possible, provided that the second connection electrode 76 and interconnect lines 77 are not short-circuited with respect to the silicon substrate 22. Since the interconnect lines 77 are formed on the first connection electrode 23 of the semiconductor chip 21, the interconnect lines 77 can be positively joined to the first connection electrode 23 simultaneously with the formation of the second connection electrode 76 and interconnect lines 77. By doing so, it is possible to eliminate the need to make any bonding check. Since, in this case, the interconnect line 77 is formed in the interconnection groove 73 and in the opening 71 in the insulating layer 70, the interconnect lines 77 can be less short-circuited with respect to other associated electronic component parts without providing the protective layer 78.

Although, in the third embodiment, the projection 66 as shown in FIG. 12 is formed with the use of the polyimide-series resin for instance, the present invention is not restricted thereto. Use may be made of a metal material differing from the material of the first connection electrode 23 and having a greater selection ratio with respect to the etchant. Or use may also be made of a proper resin differing from the material of the insulating layer 70 and having a greater selection ratio with respect to the etchant. In this case, the projection 66 can be removed without relying upon the photolithography process. An electroless-plated layer may be formed, without forming the protective layer 78, in which case it is formed of a metal material, such as gold, hard to oxidize on the surface of the interconnect lines 77. Since, in this case, the interconnect line 77 is formed in the groove 73 and in the opening 71 in the insulating layer 70, the interconnect lines 77 can be less short-circuited with other electronic component units, etc., without any protective layer 78. And the insulating layer 70 and protective layer 78 wholly cover the semiconductor chip 21, so that an added strength can be ensured.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A semiconductor device comprising:
   a semiconductor substrate having an upper surface and a lower surface;
   a plurality of first connection electrodes formed on the upper surface of the semiconductor substrate;
   a first insulating layer wholly covering the upper surface of the semiconductor substrate having a plurality of first openings over the first connection electrodes;
   a second insulating layer formed on the first insulating layer having a plurality of second openings over the plurality of first openings;
   a plurality of surface active layers formed at predetermined places on the surface of the second insulating film which continuously extend from the inside of the second openings;
   a plurality of interconnect lines having a plurality of second connection electrodes formed on the first connection electrodes, in the first and second openings and on the surface active layers;
   a third insulating layer wholly covering the surfaces of the second insulating layer and the interconnect lines, from which parts of the second connection electrodes are exposed; and
   a plurality of conductive bumps formed on the parts of second connection electrodes.

2. The semiconductor device according to claim 1, wherein the second and third insulating layers comprise at least one of an epoxy resin and a polyimide resin.

3. The semiconductor device according to claim 1, wherein the plurality of conductive bumps are such that a pitch between adjacent conductive bumps is longer than a pitch between adjacent first connection electrodes.

4. The semiconductor device according to claim 1, wherein the first insulating layer comprises an inorganic material.

5. The semiconductor device according to claim 1 wherein the interconnect lines each comprise at least one conductive layer.

6. The semiconductor device according to claim 5, wherein the conductive layers comprise materials arranged in an ionization-tendency increasing order from a surface active layer side.

7. The semiconductor device according to claim 1, wherein each of the interconnect lines includes a conductive paste filled in an interconnect line formation area and second connection electrode formation area, the interconnect line formation area containing an exposed surface of the first connection electrode in that opening in the second insulating layer which has the same configuration as the surface active layer.

8. The semiconductor device according to claim 1, wherein each of the interconnect lines includes a first conductor buried in the first and second openings and a second conductor formed on the first conductor and on the surface active layer.

9. The semiconductor device according to claim 1, wherein the first connection electrodes of the semiconductor substrate are arranged along the peripheral edge of the semiconductor substrate and the conductive bumps are arranged in a matrix array over a whole surface of the second insulating film.

10. The semiconductor device according to claim 7, wherein the conductive paste comprises a paste prepared by mixing conductive particles containing silver, gold, solder, carbon, zinc, nickel, copper, an alloy including at least one of silver, gold, solder, carbon, zinc, nickel, or copper, or an insulating resin including at least one of an epoxy-series resin and polyimide-series resin.

11. The semiconductor substrate according to claim 1, wherein the surface active layers are hydrophilic.

12. A semiconductor device comprising:
   a semiconductor substrate having an upper surface and a lower surface;
   a plurality of first connection electrodes formed on the upper surface of the semiconductor substrate;
   a first insulating layer formed on the upper surface of the semiconductor substrate and on the first connection electrodes and having a plurality of first openings over the first connection electrodes;
   a second insulating layer covering the upper surface, side surface and lower surface of the semiconductor substrate and having a plurality of second openings formed over the first openings, at the upper surface side of the substrate and a plurality of third openings formed on the lower surface side of the substrate;
   a plurality of grooves formed at predetermined places in the surface of the second insulating layer and continuously connecting the first, second and third openings;
   a plurality of surface active layers formed in the grooves;
   a plurality of interconnect lines formed on the surfaces of the surface active layers and connecting the first connection electrodes formed on the upper surface of the substrate to the second connection electrodes formed beneath the lower surface side of the substrate; and
   a plurality of conductive bumps formed on the second connection electrodes and over the third openings.

13. The semiconductor substrate according to claim 12, wherein the surface active layers are hydrophilic.

* * * * *